United States Patent
Hirayama et al.

(10) Patent No.: US 9,306,091 B2
(45) Date of Patent: Apr. 5, 2016

(54) LIGHT RECEIVING DEVICE

(71) Applicant: ALPS ELECTRIC CO., LTD., Tokyo (JP)

(72) Inventors: Motoki Hirayama, Niigata-ken (JP); Hironori Namba, Niigata-ken (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 0 days.

(21) Appl. No.: 14/524,709

(22) Filed: Oct. 27, 2014

(65) Prior Publication Data
US 2015/0115384 A1 Apr. 30, 2015

(30) Foreign Application Priority Data

Oct. 29, 2013 (JP) .................................. 2013-224625

(51) Int. Cl.
*H01L 31/0232* (2014.01)
*H01L 27/146* (2006.01)

(52) U.S. Cl.
CPC ...... *H01L 31/02325* (2013.01); *H01L 27/1464* (2013.01); *H01L 27/14621* (2013.01); *H01L 27/14627* (2013.01)

(58) Field of Classification Search
CPC ............ H01L 27/14627; H01L 27/14621; H01L 27/1464; H01L 27/14685; H01L 27/14625; Y02E 10/50; Y02E 10/52; B82Y 20/00
See application file for complete search history.

(56) References Cited

U.S. PATENT DOCUMENTS

| | | | | |
|---|---|---|---|---|
| 2010/0102410 A1* | 4/2010 | Shimizu et al. | ............... | 257/435 |
| 2010/0283086 A1* | 11/2010 | Lee et al. | ...................... | 257/222 |
| 2011/0215432 A1* | 9/2011 | Uematsu et al. | .............. | 257/432 |
| 2011/0243512 A1* | 10/2011 | Takai et al. | ..................... | 385/92 |
| 2012/0034729 A1* | 2/2012 | Tan et al. | ......................... | 438/69 |

FOREIGN PATENT DOCUMENTS

| | | | |
|---|---|---|---|
| JP | 2007-048795 A | 2/2007 | |
| JP | WO2014065373 | * 1/2014 | ............. H01L 27/14 |

OTHER PUBLICATIONS

Machine translation of WO2014065373.*

* cited by examiner

*Primary Examiner* — Michelle Mandala
(74) *Attorney, Agent, or Firm* — Brinks Gilson & Lione (57) ABSTRACT

A light receiving device includes an optical substrate disposed over a light receiving surface. In the optical substrate, a first optical multilayer film is formed on an incident surface, a second optical multilayer film is formed on a surface opposite the incident surface, and a third optical multilayer film is formed on the light receiving surface. Light of two wavelength regions separated from each other is transmitted, and light of wavelength regions other than the two wavelength regions is blocked. The two wavelength regions include a first wavelength region on the short wavelength side and a second wavelength region on the long wavelength side. At least a predetermined proportion of light of the second wavelength region is transmitted, and the transmittance of light of the first wavelength region is limited within a predetermined range less than the predetermined proportion.

10 Claims, 7 Drawing Sheets

LIGHT RECEIVING DEVICE

CLAIM OF PRIORITY

This application claims benefit of priority to Japanese Patent Application No. 2013-224625 filed on Oct. 29, 2013, which is hereby incorporated by reference in its entirety.

BACKGROUND

1. Field of the Disclosure

The present disclosure relates to a light receiving device capable of receiving light of a specific wavelength region.

2. Description of the Related Art

A light sensor module is disclosed in Japanese Unexamined Patent Application Publication No. 2013-79852. A light receiving device employed in this light sensor module includes a light receiving element that generates current according to the quantity of received light, and a wavelength selection filter member that is disposed on the light incident side of the light receiving element. This wavelength selection filter member has a constitution in which wavelength selection filter films are laminated on an optical substrate, and transmits light of a desired wavelength incident on the incident surface.

However, since the light receiving device described in Japanese Unexamined Patent Application Publication No. 2013-79852 has a constitution in which wavelength selection filter films are laminated on one surface of an optical substrate, the setting of a transmittance wavelength band is limited. To solve this problem, an optical substrate on which wavelength selection filter films are laminated can be added. However, in this case, since the number of optical substrates increases, the thickness of the whole light receiving device increases, and the light sensor module may increase in size.

SUMMARY

A light receiving device includes a light receiving element, and an optical substrate disposed over the light receiving element. The optical substrate has a facing surface facing the light receiving element and an incident surface facing the light incident side, a first optical multilayer film is formed on the incident surface, a second optical multilayer film is formed on the facing surface, and a third optical multilayer film is formed on the light receiving element. The wavelength band of light received by the light receiving element is determined by the three optical multilayer films.

Therefore, light of a desired wavelength band can be transmitted at a desired transmittance without adding a new optical substrate.

DESCRIPTION OF THE EXEMPLARY EMBODIMENTS

Figure 1:
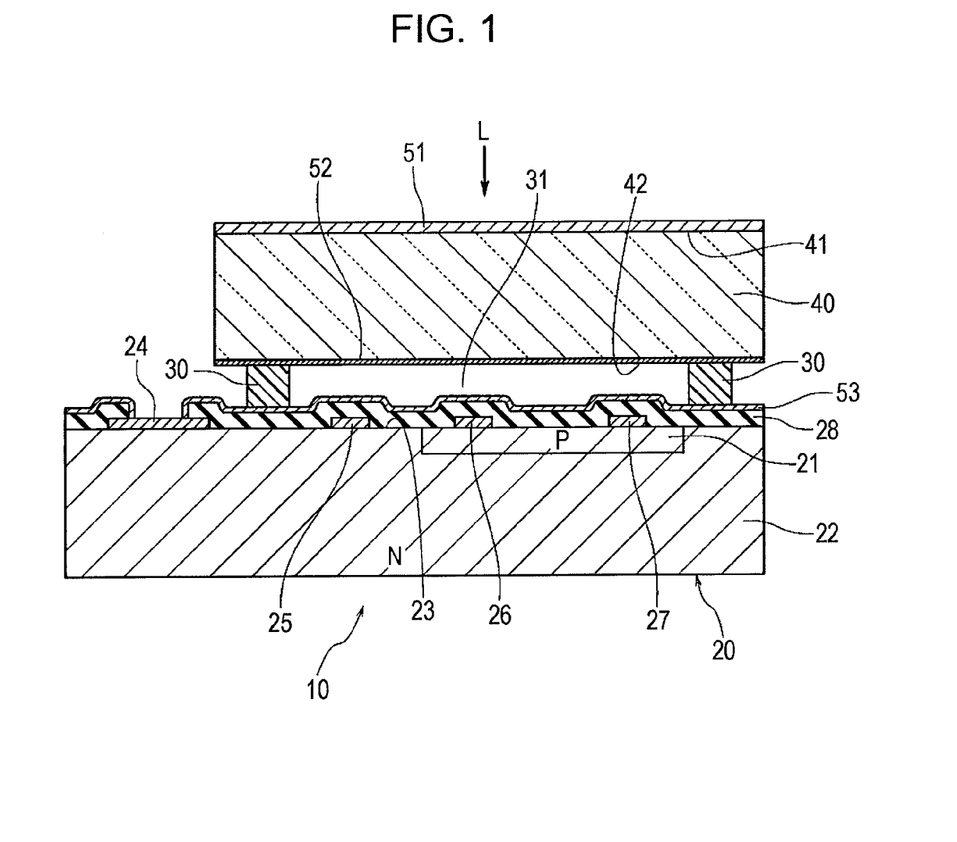
FIG. 1 is a schematic sectional view showing the constitution of a light receiving device according to an embodiment of the present invention.

A light receiving device according to an embodiment of the present invention will now be described in detail with reference to the drawings. FIG. 1 is a schematic sectional view showing the constitution of the light receiving device 10 according to the embodiment of the present invention. FIG. 1 is a sectional view taken along the direction L in which light is incident on the light receiving device 10, and is a sectional view of substantially the center of the light receiving device 10 in a plane perpendicular to the direction L.

The light receiving device 10 includes a PN type photodiode 20 as a light receiving element, and a glass substrate 40 as an optical substrate disposed on the light incident side of the photodiode 20 with a space therebetween. The glass substrate 40 is formed, for example, of a quartz glass (refractive index 1.52), and is fixed to the photodiode 20, with a predetermined space 31 therebetween, by an adhesive layer 30.

The photodiode 20 has a constitution in which a P layer 21 and an N layer 22 are joined together. Surface electrodes 25, 26, and 27 and land electrodes 24 are formed on a light receiving surface 23 of the photodiode 20. The surface electrodes 25, 26, and 27 and the land electrodes 24 are formed by processing an aluminum film, for example, by photolithography.

An insulating layer 28 is formed on the light receiving surface 23 and the surface electrodes 25, 26, and 27 so as to cover the upper surfaces thereof. The insulating layer 28 is formed, for example, by sputtering of SiN. A third optical multilayer film 53 is formed on the insulating layer 28.

The land electrodes 24 are for external electrical connection. Parts of the insulating layer 28 and the third optical multilayer film 53 that are located over the land electrodes 24 are removed by etching or the like. For example, bonding wires (not shown) connected to an external power source (not shown) are connected to the exposed surfaces of the land electrodes 24.

The surface electrodes 25, 26, and 27 are connected to respective land electrodes 24. For example, the surface electrodes 26 and 27 formed on the P layer 21 are connected to the positive electrode of the external power source and the surface electrode 25 formed on the N layer 22 is connected to the negative electrode of the external power source through the land electrodes 24.

The adhesive layer 30 is formed, for example, of a thermoset adhesive or an ultraviolet cure adhesive.

A first optical multilayer film 51 is formed on an incident surface 41 of the glass substrate 40 that faces the light incident side, and a second optical multilayer film 52 is formed on a facing surface 42 of the glass substrate 40 that faces the photodiode 20.

The first optical multilayer film 51 is a film formed, for example, by alternately laminating $SiO_x$ layers and $TiO_x$ layers, and is formed, for example, by alternately laminating $SiO_2$ layers (refractive index 1.48) and $TiO_2$ layers (refractive index 2.22) such that a multilayer structure of a predetermined number of 10 or more layers is formed. This lamination is performed by a PVD (Physical vapor deposition) method such as sputtering or evaporation, or a CVD (Chemical vapor deposition) method. The constitution and forming method of the second optical multilayer film 52 are the same as those of the first optical multilayer film 51.

The third optical multilayer film 53 is directly formed on the surface of the insulating layer 28 covering the photodiode 20, and is a multilayer film formed by alternately laminating $SiO_x$ layers and $TiO_x$ layers. The lamination is performed by PVD or CVD as with the first optical multilayer film 51 and the second optical multilayer film 52. The number of layers constituting the third optical multilayer film 53 is less than that of the first optical multilayer film 51 and the second optical multilayer film 52. For example, the number of $SiO_2$ layers and the number of $TiO_2$ layers are each less than 10. Therefore, the film thickness of the layers constituting the third optical multilayer film 53 is sufficiently less than the film thickness of the first optical multilayer film 51 and the second optical multilayer film 52, and the film thickness of the layers constituting the third optical multilayer film 53 is less than 1.0 μm.

As described later, the first optical multilayer film 51 and the second optical multilayer film 52 are set so as to obtain a transmission property satisfying a severe condition that, of incident light, light in two bands is transmitted. In order to achieve the transmission property, the number of the $SiO_x$ layers and the number of the $TiO_x$ layers need to be increased, and the control of their respective film thicknesses requires accuracy. Therefore, the first optical multilayer film 51 and the second optical multilayer film 52 need to be formed on the incident surface 41 and the facing surface 42, which are smooth surfaces, of the glass substrate 40.

As for the light transmission property of the third optical multilayer film 53, it performs a function to limit the transmittance of light of the wavelength region on the short wavelength side (first wavelength region) out of light of two bands passing through the first optical multilayer film 51 and the second optical multilayer film 52, and the required transmission property is not as severe as with the first optical multilayer film 51 and the second optical multilayer film 52. Therefore, the third optical multilayer film 53 requires only a small number of layers and only a small thickness, the tolerance of the film thickness of each layer is relatively wide, and the third optical multilayer film 53 can be formed on the uneven surface having the surface electrodes 25, 26, and 27.

If either the first optical multilayer film 51 or the second optical multilayer film 52 is formed on the surface of the insulating layer 28, and the third optical multilayer film 53 is formed on either the incident surface 41 or the facing surface 42 of the glass substrate 40, the following problem arises.

First, if the first optical multilayer film 51 or the second optical multilayer film 52, which is a film having a large number of layers and a large thickness, is formed on one surface of the glass substrate 40, and the third optical multilayer film 53, which is a film having a small number of layers and a small thickness, is formed on the other surface, bending stress remains in the glass substrate 40, and it is difficult to join the glass substrate 40 to the photodiode 20 in the following process. In addition, since the first optical multilayer film 51 and the second optical multilayer film 52 have a large number of layers and a large thickness, it is difficult to form these films on the uneven surface of the insulating layer 28 such that they have a uniform film thickness. Also in this regard, it is preferable to form the third optical multilayer film 53 on the insulating layer 28.

Film formation on the photodiode 20 and film formation on the glass substrate 40 are performed in separate processes.

In the case of film formation on the photodiode 20, after forming the surface electrodes 25, 26, and 27 and the land electrode 24 on the light receiving surface 23, the insulating layer 28 and the third optical multilayer film 53 are laminated in this order. After that, parts of the insulating layer 28 and the third optical multilayer film 53 that are located over the land electrodes 24 are removed to expose the surfaces of the land electrodes 24.

In the case of film formation on the glass substrate 40, after polishing and cleaning the incident surface 41 and the facing surface 42 such that they have a predetermined roughness, the first optical multilayer film 51 is formed on the incident surface 41 with the facing surface 42 and the side surfaces masked, and then the second optical multilayer film 52 is formed on the facing surface 42 with the incident surface 41 and the side surfaces masked. The formation of the first optical multilayer film 51 and the formation of the second optical multilayer film 52 may be performed in reverse order.

The adhesive layer 30 is applied to a predetermined position on the surface of the photodiode 20 produced as above, the glass substrate 40 is placed thereon, and then the adhesive layer 30 is thermally hardened. Alternatively, the adhesive layer 30 is hardened by irradiating with ultraviolet light.

The respective optical properties of the first optical multilayer film 51, the second optical multilayer film 52, and the third optical multilayer film 53, and the optical property of the combination of the three optical multilayer films will now be described.

Figure 2:
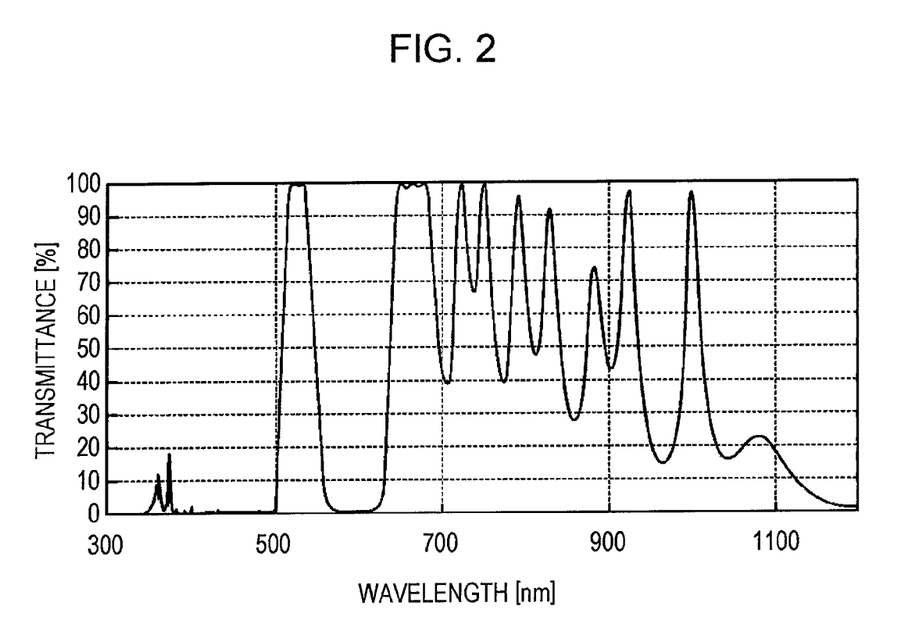
FIG. 2 is a graph showing a simulation result of the light transmission property of transmitted light of a first optical multilayer film.
Figure 3:
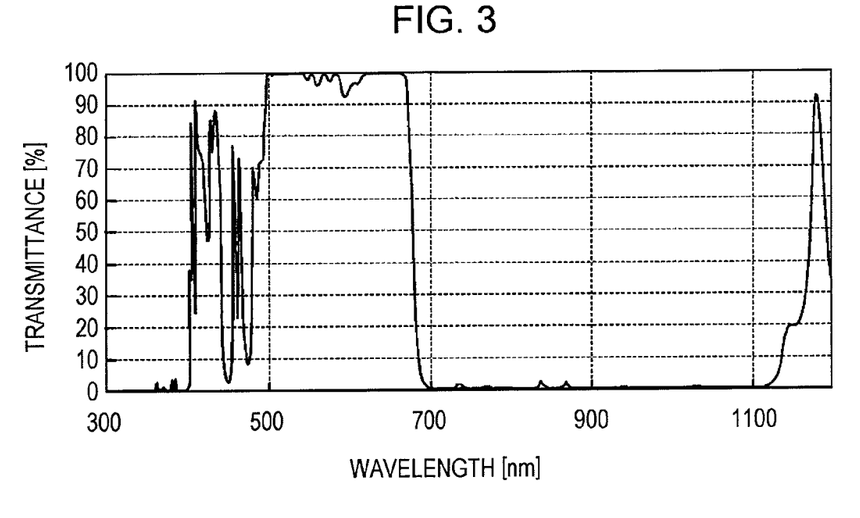
FIG. 3 is a graph showing a simulation result of the light transmission property of transmitted light of a second optical multilayer film.
Figure 4:
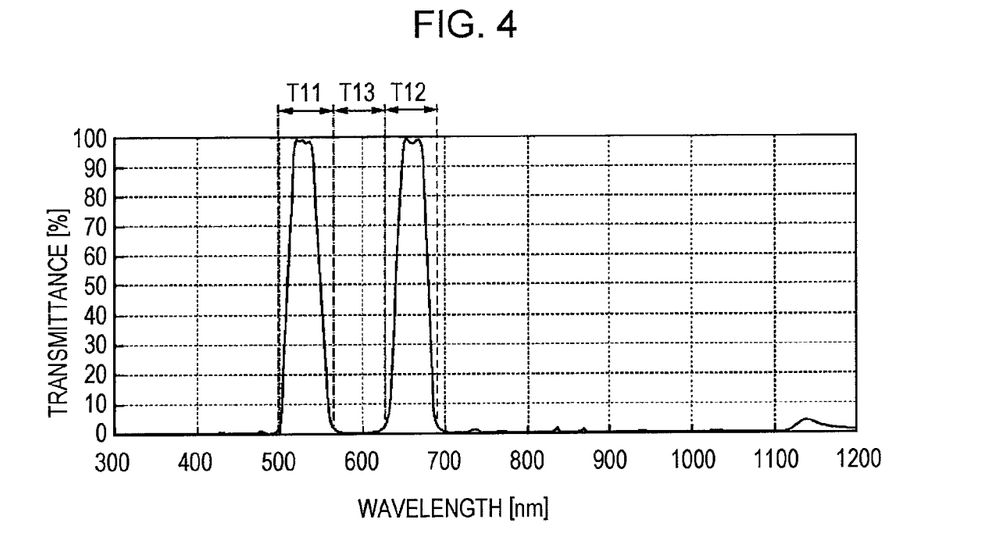
FIG. 4 is a graph showing a simulation result of the light transmission property of transmitted light of a glass substrate on which the first optical multilayer film and the second optical multilayer film are formed.

Optical properties obtained by the first optical multilayer film 51 and the second optical multilayer film 52 are shown in FIG. 2 to FIG. 4.

FIG. 2 is a graph showing a simulation result of the light transmission property with respect to transmitted light of the first optical multilayer film 51. FIG. 3 is a graph showing a simulation result of the light transmission property with respect to transmitted light of the second optical multilayer film 52. FIG. 4 is a graph showing a simulation result of the light transmission property with respect to transmitted light of the glass substrate 40 on which the first optical multilayer film 51 and the second optical multilayer film 52 are formed. The term "light transmission property" as used herein means the relationship between incident light on an object (the first optical multilayer film 51, the second optical multilayer film 52, the glass substrate 40) and the transmittance of the object.

The first optical multilayer film 51 is formed by alternately laminating $SiO_2$ layers (refractive index 1.48) and $TiO_2$ layers (refractive index 2.22) on a quartz glass (refractive index 1.52) such that a multilayer constitution of 10 or more layers is formed. By adjusting the number of layers and the film thickness of each layer, an optical multilayer film having the property shown in FIG. 2 is achieved.

The second optical multilayer film 52 is also formed by alternately laminating $SiO_2$ layers (refractive index 1.48) and $TiO_2$ layers (refractive index 2.22) on a quartz glass (refractive index 1.52) such that a multilayer constitution of 10 or more layers is formed. By adjusting the number of layers and the film thickness of each layer, an optical multilayer film having the property shown in FIG. 3 is achieved.

The arrangement of the first optical multilayer film 51 and the second optical multilayer film 52 relative to the glass substrate 40 may be reversed, that is, the first optical multilayer film 51 may be formed on the facing surface 42, and the second optical multilayer film 52 may be formed on the incident surface 41.

As shown in FIG. 4, by transmitting light through the first optical multilayer film 51, the glass substrate 40, and the second optical multilayer film 52 in this order from the incident surface 41 side, light of a wavelength region centered at 530 nm (first wavelength region) T11 and a light component of a wavelength region centered at 660 nm (second wavelength region) T12 can be transmitted. In the transmission property shown in FIG. 4, the wavelength region T11 and the wavelength region T12 are in separate wavelength bands, and a wavelength region T13 where the transmittance is almost zero exists between the transmission bands T11 and T12.

In the wavelength region T11, the rising wavelength (50% transmission wavelength) is 500 nm, the falling wavelength (50% transmission wavelength) is 560 nm, and the transmittance at the peak wavelength region is 90% or more. In the wavelength region T12, the rising wavelength is 640 nm, the falling wavelength is 680 nm, and the transmittance at the peak wavelength region is 90% or more. When light is transmitted through the first optical multilayer film 51, the glass substrate 40, and the second optical multilayer film 52, in the range of 300 to 1100 nm, light of wavelength regions other than the wavelength region T11 and the wavelength region T12 is blocked by the first optical multilayer film 51 and the second optical multilayer film 52, and the transmittance thereof is almost zero.

Figure 5:
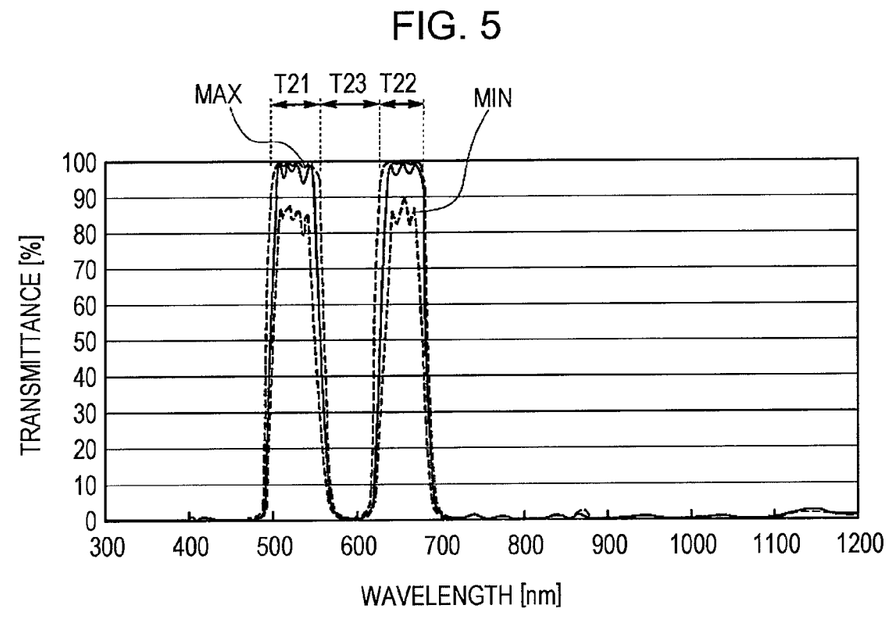
FIG. 5 is a graph showing the light transmission property of transmitted light of the glass substrate on which the first optical multilayer film and the second optical multilayer film are formed.
Figure 6:
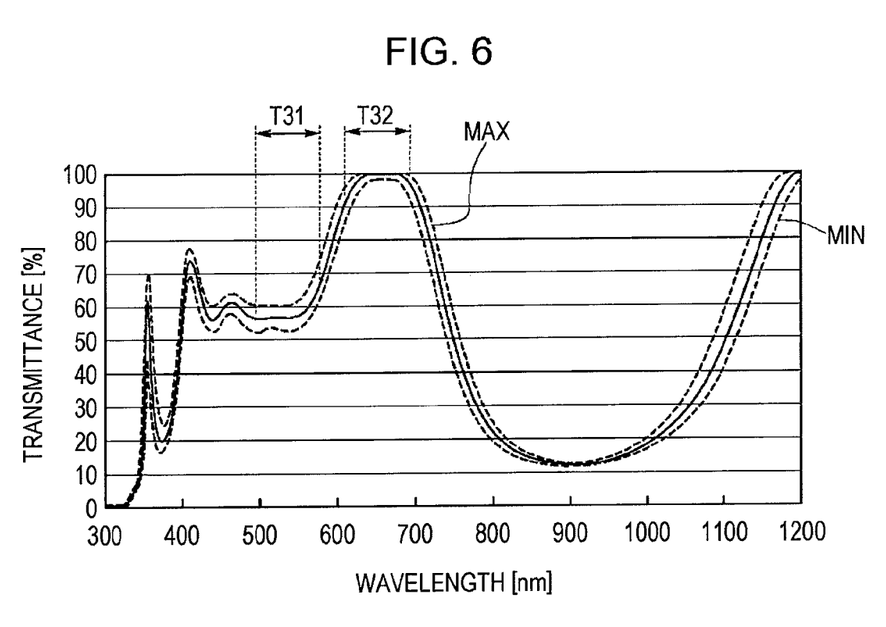
FIG. 6 is a graph showing the light transmission property of transmitted light of a third optical multilayer film.
Figure 7:
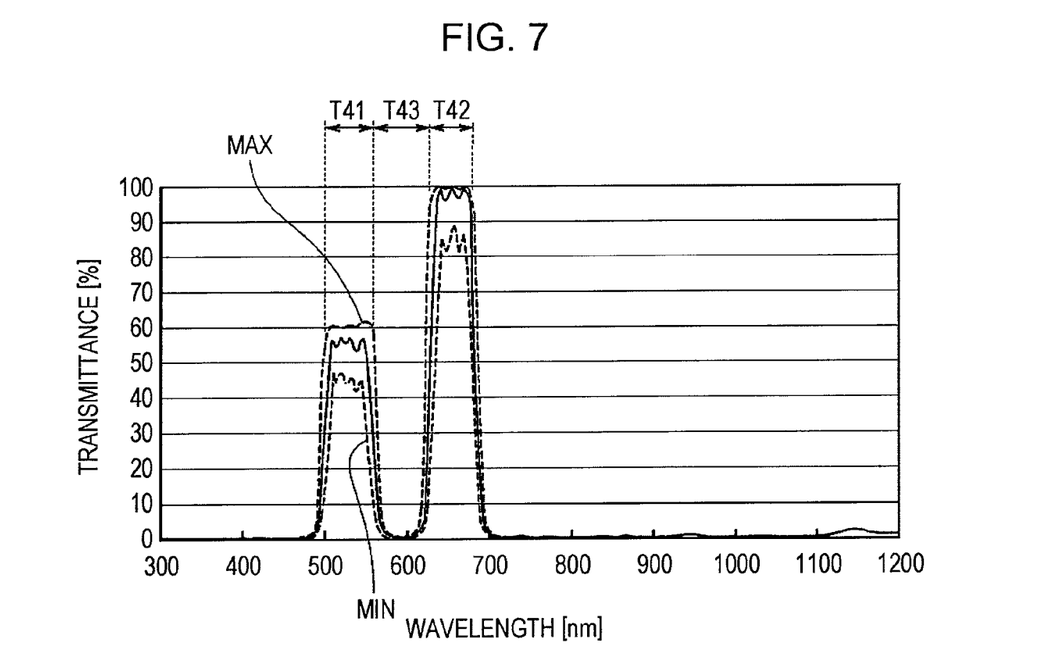
FIG. 7 is a graph showing the light transmission property when light is transmitted through three optical multilayer films: the glass substrate on which the first optical multilayer film and the second optical multilayer film are formed, and the third optical multilayer film.

The optical property of the combination of three optical multilayer films: the first optical multilayer film 51, the second optical multilayer film 52, and the third optical multilayer film 53 is shown in FIG. 5 to FIG. 7.

FIG. 5 is a graph showing the light transmission property of transmitted light of the glass substrate 40 on which the first optical multilayer film 51 and the second optical multilayer film 52 are formed. The transmission property of FIG. 5 is substantially the same as the transmission property shown in FIG. 4. FIG. 6 is a graph showing the light transmission property of transmitted light of the third optical multilayer film 53. FIG. 7 is a graph showing the light transmission property of light transmitted through three optical multilayer films: the first optical multilayer film 51, the second optical multilayer film 52, and the third optical multilayer film 53.

In FIG. 5, the maximum value MAX and the minimum value MIN of the tolerance when the tolerance (variation) estimated in the design when a multilayer film is formed of $SiO_2$ layers (refractive index 1.48) and $TiO_2$ layers (refractive index 2.22) is simulated are shown by dashed lines. The solid line shows the tolerance-free design light transmission property.

The layer constitution of the first optical multilayer film 51 and the second optical multilayer film 52 when the simulation result shown in FIG. 5 is obtained slightly differs from the layer constitution when the simulation result shown in FIG. 4 is obtained, in the number of layers and film thickness. Therefore, the wavelength region T22 on the long wavelength side is slightly different from the wavelength region T12 of FIG. 4. However, the basic property of transmitting two wavelength regions T21 and T22 is substantially the same in FIG. 4 and FIG. 5.

The third optical multilayer film 53 is formed by alternately laminating $SiO_2$ layers (refractive index 1.48) and $TiO_2$ layers (refractive index 2.22) on a quartz glass (refractive index 1.52) such that a multilayer of less than 10 layers is formed. By adjusting the film thickness of each layer, an optical multilayer film having the property shown in FIG. 6 is achieved.

As shown in FIG. 5, by transmitting light through the first optical multilayer film 51, the glass substrate 40, and the second optical multilayer film 52 in this order, light in a wavelength region on the short wavelength side (first wavelength region) T21 and light in a wavelength region on the long wavelength side (second wavelength region) T22 are obtained. The band of the wavelength region T21 is the same as the band of the wavelength region T11 on the short wavelength side shown in FIG. 4, and the wavelength region T22 on the long wavelength side is slightly shifted to the short wavelength side as compared to the wavelength region T12 shown in FIG. 4. The transmittance (average value) at the design value (solid line) of the wavelength regions T21 and T22 shown in FIG. 5 is 90% or more.

As shown in FIG. 6, in the case of transmitted light of the third optical multilayer film 53, the transmittance of the wavelength region T32 corresponding to the wavelength region T22 of FIG. 5 is almost 100%, and the transmittance of the wavelength region T31 corresponding to the wavelength region T21 on the short wavelength side of FIG. 5 is about 57% (average value).

By transmitting light through the first optical multilayer film 51, the glass substrate 40, the second optical multilayer film 52, and the third optical multilayer film 53, light shown in FIG. 7 is obtained. In the transmitted light shown in FIG. 7, in the wavelength region T42 corresponding to the above wavelength regions T22 and T32, a transmittance of 90% or more is secured. On the other hand, in the wavelength region T41 corresponding to the above wavelength regions T21 and T31, while maintaining the wavelength range, the transmittance is suppressed to about 57% on average, and within a range of 40 to 60% including variation.

As shown in FIG. 7, in the case of light passing through the three optical multilayer films 51, 52, and 53, the wavelength region T41 and the wavelength region T42 are separated from each other with a wavelength region T43 where the transmittance is almost zero therebetween. Light of the wavelength regions other than the wavelength region T41 and the wavelength region T42 is blocked by the first optical multilayer film 51, the second optical multilayer film 52, and the third optical multilayer film 53, and the transmittance thereof is almost zero.

By adding the third optical multilayer film 53 that limits transmission of light of a fixed wavelength region T31 as shown in FIG. 6, a light receiving property of a desired profile shown in FIG. 7 can be obtained without adding a new optical substrate such as a second glass substrate.

The wavelength region and intensity of light received by the photodiode 20 can be adjusted by changing the layer constitution (for example, the layer material, the film thickness, and the number of layers) of the first optical multilayer film 51, the second optical multilayer film 52, and the third optical multilayer film 53. If adjustment is performed using three multilayer films, control is easier than when wavelength region and transmitted light intensity (light receiving intensity) are adjusted using one or two multilayer films. By making the number of layers of the third optical multilayer film 53 smaller than the number of layers of the first optical multilayer film 51 and the second optical multilayer film 52, the burden share of layer adjustment in the third optical multilayer film 53 is reduced, and therefore a desired layer constitution is easily achieved even on the uneven photodiode 20. Since the control of wavelength band is performed mainly by the first optical multilayer film 51 and the second optical multilayer film 52, and the control of light intensity in the controlled wavelength bands is performed by the third optical multilayer film 53, the third optical multilayer film 53 requires only a small number of layers and only a small thickness, and therefore the formation of the third optical multilayer film 53 can be performed easily.

As a desired light transmission property, the ratio of the light transmittance in the first wavelength region to the light transmittance in the second wavelength region is preferably 70 to 80%. The light transmittance in the first wavelength region is preferably 90% or more, and the range of the light transmittance in the second wavelength region is preferably 40 to 60%. The first wavelength region preferably includes 500 to 560 nm, and the second wavelength region preferably includes 640 to 680 nm.

Although the present invention has been described with reference to the above embodiment, the present invention is not limited to the above embodiment, and modifications and changes may be made without departing from the object of the modifications or the spirit of the present invention.

As described above, the light receiving device according to the present invention is useful in receiving a desired wavelength band at a desired intensity without increasing the size.

What is claimed is:

1. A light receiving device comprising:
    a light receiving element, the light receiving element having an uneven surface structure including surface electrodes disposed on a light receiving surface of a photodiode, and an insulating layer directly connected to the light receiving surface and the surface electrodes so as to cover an upper surfaces thereof; and
    an optical substrate disposed over the light receiving element,
    wherein the optical substrate has a facing surface facing the light receiving element and an incident surface facing the light incident side, a first optical multilayer film is disposed on the incident surface, a second optical multilayer film is disposed on the facing surface, and a third optical multilayer film is disposed on the insulating layer of the light receiving element,
    wherein: the first optical multilayer film comprises alternately laminated layers of different refractive indexes and the first optical film has a first light transmission property defined by the alternately laminated layers in the first optical multilayer film and by adjusting the number of layers and the film thickness of each layer; the second optical multilayer film comprises alternately laminated layers of different refractive indexes and the second optical film has a second light transmission property defined by the alternately laminated layers in the second optical multilayer film and by adjusting the number of layers and the film thickness of each layer; and the third optical multilayer film comprises alternately laminated layers of different refractive indexes and the third optical film has a third light transmission property defined by the alternately laminated layers in the third optical multilayer film and by adjusting the number of layers and the film thickness of each layer and the number of layers constituting the third optical multilayer film is less than that of the first optical multilayer film and the second optical multilayer film; and
    wherein the wavelength band of light received by the light receiving element is determined by the three optical multilayer films with individually different light transmission properties.

2. The light receiving device according to claim 1,
    wherein the three optical multilayer films transmit light in two wavelength regions separated from each other, and
    wherein the two wavelength regions include a first wavelength region on the short wavelength side, and a second wavelength region on the long wavelength side, and the transmittance of light of the first wavelength region is limited to be lower than the transmittance of light of the second wavelength region.

3. The light receiving device according to claim 2,
    wherein the first optical multilayer film and the second optical multilayer film transmit light of the two wavelength regions, and
    wherein the transmittance of light of the first wavelength region is limited to be lower than the transmittance of light of the second wavelength region by the third optical multilayer film.

4. The light receiving device according to claim 2,
    wherein the transmittance of light in the second wavelength region is 90% or more, and the range of the transmittance of light in the first wavelength region is 40 to 60%.

5. The light receiving device according to claim 2,
    wherein the first wavelength region includes 500 to 560 nm, and the second wavelength region includes 640 to 680 nm.

6. The light receiving device according to claim 1,
    wherein the first optical multilayer film and the second optical multilayer film are multilayer films alternately laminated $TiO_2$ layers and $SiO_2$ layers.

7. The light receiving device according to claim 1,
    wherein the film thickness of the third optical multilayer film is less than the thickness of the first optical multilayer film and the second optical multilayer film.

8. The light receiving device according to claim 7,
    wherein the facing surface and the incident surface of the optical substrate are smooth surfaces, and the first optical multilayer film and the second optical multilayer film are disposed on the smooth surfaces.

9. The light receiving device according to claim 7,
    wherein the surface of the light receiving element is an uneven surface, and the third optical multilayer film is disposed on the uneven surface.

10. The light receiving device according to claim 1, wherein the first optical multilayer film and the second optical multilayer film are configured to control a wavelength band, and third optical multilayer film is configured to control light intensity.

* * * * *